US010136548B2

United States Patent
Chen et al.

(10) Patent No.: US 10,136,548 B2
(45) Date of Patent: Nov. 20, 2018

(54) SLIDE RAIL ASSEMBLY FOR RACK SYSTEM

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Yao-Tsung Chen, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/365,881

(22) Filed: Nov. 30, 2016

(65) Prior Publication Data

US 2018/0027690 A1    Jan. 25, 2018

(30) Foreign Application Priority Data

Jul. 19, 2016   (TW) .............................. 105122848 A

(51) Int. Cl.
```
H05K 7/00      (2006.01)
H05K 7/18      (2006.01)
F16C 29/00     (2006.01)
F16C 29/02     (2006.01)
H05K 7/14      (2006.01)
```
(52) U.S. Cl.
CPC ........... *H05K 7/183* (2013.01); *F16C 29/004* (2013.01); *F16C 29/02* (2013.01); *H05K 7/1489* (2013.01)

(58) Field of Classification Search
CPC .... H05K 7/183; A47B 88/427; A47B 88/403; A47B 96/06
USPC ....... 312/334.7, 223.1, 334.4, 334.5; 211/26, 211/189
See application file for complete search history.

(56) References Cited

U.S. PATENT DOCUMENTS

| | | | |
|---|---|---|---|
| 6,220,456 B1 | 4/2001 | Jensen | |
| 6,297,962 B1 | 10/2001 | Johnson | |
| 7,810,653 B2 * | 10/2010 | Schmidtke | ........... H05K 7/1421 211/26 |
| 7,911,777 B2 * | 3/2011 | Fan | ........................ G06F 1/187 312/223.1 |
| 8,127,940 B2 | 3/2012 | Henderson | |
| 8,317,037 B2 | 11/2012 | Henderson | |

(Continued)

FOREIGN PATENT DOCUMENTS

| | | |
|---|---|---|
| EP | 2 870 897 A1 | 5/2015 |
| EP | 3 013 129 A1 | 4/2016 |

(Continued)

*Primary Examiner* — Janet M Wilkens
(74) *Attorney, Agent, or Firm* — Winston Hsu

(57) ABSTRACT

A slide rail assembly for a rack system is configured to mount a chassis to a rack. A fixing member is arranged on one side of the chassis. The slide rail assembly comprises a guide rail having a first rail section, a second rail section and a third rail section. The first rail section is configured to support a portion of the chassis. A path is defined between the second rail section and the third rail section for allowing the fixing member on the chassis to pass through.

14 Claims, 5 Drawing Sheets

(56) References Cited

U.S. PATENT DOCUMENTS

| | | | |
|---|---|---|---|
| 8,371,454 B2 * | 2/2013 | Chen .................... | H05K 7/1421 |
| | | | 211/26 |
| 2007/0018547 A1 * | 1/2007 | Yang .................... | H05K 7/1489 |
| | | | 312/333 |
| 2011/0024592 A1 | 2/2011 | Yu | |
| 2015/0181753 A1 * | 6/2015 | Murakami ........... | H05K 7/1489 |
| | | | 211/26 |
| 2017/0340109 A1 * | 11/2017 | Chen .................... | H05K 7/183 |

FOREIGN PATENT DOCUMENTS

| | | | |
|---|---|---|---|
| EP | 3157313 | * | 1/2017 |
| EP | 3197252 | * | 1/2017 |
| EP | 3157314 | * | 4/2017 |
| JP | 2007272293 A | | 10/2007 |
| JP | 2009279410 A | | 12/2009 |
| JP | 2015122376 A | | 7/2015 |
| JP | 2017076770 | * | 1/2017 |
| JP | 2017076771 | * | 1/2017 |
| JP | 2017127621 | * | 1/2017 |

* cited by examiner

SLIDE RAIL ASSEMBLY FOR RACK SYSTEM

BACKGROUND OF THE INVENTION

1. Field of the Invention

The present invention relates to a slide rail assembly for a rack system, and more particularly, to a slide rail assembly capable of quickly mounting chassis with different specifications and firmly supporting the chassis.

2. Description of the Prior Art

U.S. Pat. No. 6,220,456 B1 of Jensen et al. discloses a rack having two posts. A rail is attached to each post. Each of the rails includes two ribs that together define a slot. One end of the slot has a greater separation between the ribs. Two sides of a chassis are mounted with fixing members. Through the above arrangement, the fixing members on the chassis can be fit into the slot through the greater separation in order to support the chassis.

However, such arrangement can only mount fixing members of a chassis with a specific specification (such as 1U chassis). Chassis with other specifications (such as 2U chassis) cannot be supported by the rack due to insufficient supporting capability.

SUMMARY OF THE INVENTION

The present invention relates to a slide rail assembly for a rack system capable of quickly mounting chassis with different specifications and firmly supporting the chassis.

According to an embodiment of the present invention, a slide rail assembly for a rack system is configured to mount a chassis to a rack. A fixing member is arranged at one side of the chassis. The slide rail assembly comprises a guide rail. The guide rail has a first rail section, a second rail section and a third rail section. Wherein, the first rail section is bent relative to the second rail section for supporting a portion of the chassis. The third rail section is arranged above the second rail section. A path is defined between the second rail section and the third rail section for allowing the fixing member on the chassis to pass through. Wherein, when the chassis is mounted to the guide rail, the fixing member on the chassis passes through the path of the guide rail, and the fixing member on the chassis abuts against one of the second rail section and the third rail section of the guide rail.

Preferably, the slide rail assembly further comprises a supporting frame, wherein the guide rail is movably connected to the supporting frame.

Preferably, the guide rail has a bounded longitudinal hole, and is connected to the supporting frame through a connecting member passing through the longitudinal hole, such that the guide rail is movable relative to the supporting frame within a limited space.

Preferably, the fixing member on the chassis has a first fixing part and a second fixing part connected to the first fixing part. The first fixing part is connected to the chassis. An outer diameter of the second fixing part is greater than an outer diameter of the first fixing part. When the chassis is mounted to the guide rail, the fixing member on the chassis passes through the path of the guide rail, and the first fixing part of the fixing member on the chassis abuts against one of an upper edge of the second rail section and a lower edge of the third rail section. One side of the second rail section and one side of the third rail section of the guide rail are configured to support another portion of the chassis.

Preferably, the second rail section of the guide rail is located at a front end of the guide rail. The guide rail further has a rear blocking part located at a rear end of the guide rail.

Preferably, the third rail section of the guide rail is extended along a longitudinal direction of the first rail section of the guide rail and connected to the rear blocking part.

According to another embodiment, a slide rail assembly for a rack system is configured to mount a chassis to a rack. A fixing member is arranged at one side of the chassis. The slide rail assembly comprises a guide rail. The guide rail has a first rail section, a second rail section and a third rail section. Wherein, the first rail section is bent relative to the second rail section for supporting a portion of the chassis. The third rail section is arranged above the second rail section. Wherein, the fixing member on the chassis has a first fixing part and a second fixing part connected to the first fixing part. The first fixing part is connected to the chassis. An outer diameter of the second fixing part is greater than an outer diameter of the first fixing part. When the chassis is mounted to the guide rail, the first fixing part of the fixing member on the chassis abuts against a lower edge of the third rail section of the guide rail, and one side of the second rail section and one side of the third rail section of the guide rail are configured to support another portion of the chassis.

According to another embodiment, a slide rail assembly for a rack system is configured to mount a chassis to a rack. A fixing member is arranged at one side of the chassis. The slide rail assembly comprises a guide rail. The guide rail has a first rail section, a second rail section and a third rail section. Wherein, the first rail section is bent relative to the second rail section for supporting a portion of the chassis. The third rail section is arranged above the second rail section. Wherein, the fixing member on the chassis has a first fixing part and a second fixing part connected to the first fixing part. The first fixing part is connected to the chassis. An outer diameter of the second fixing part is greater than an outer diameter of the first fixing part. When the chassis is mounted to the guide rail, the first fixing part of the fixing member on the chassis abuts against an upper edge of the second rail section of the guide rail, and one side of the second rail section and one side of the third rail section of the guide rail are configured to support another portion of the chassis.

Preferably, the second rail section of the guide rail is located at a front end of the guide rail. The guide rail further has a rear blocking part located at a rear end of the guide rail. The rear blocking part of the guide rail is extended with a rear supporting part. An upper edge of the rear supporting part is configured to abut against the fixing member on the chassis.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
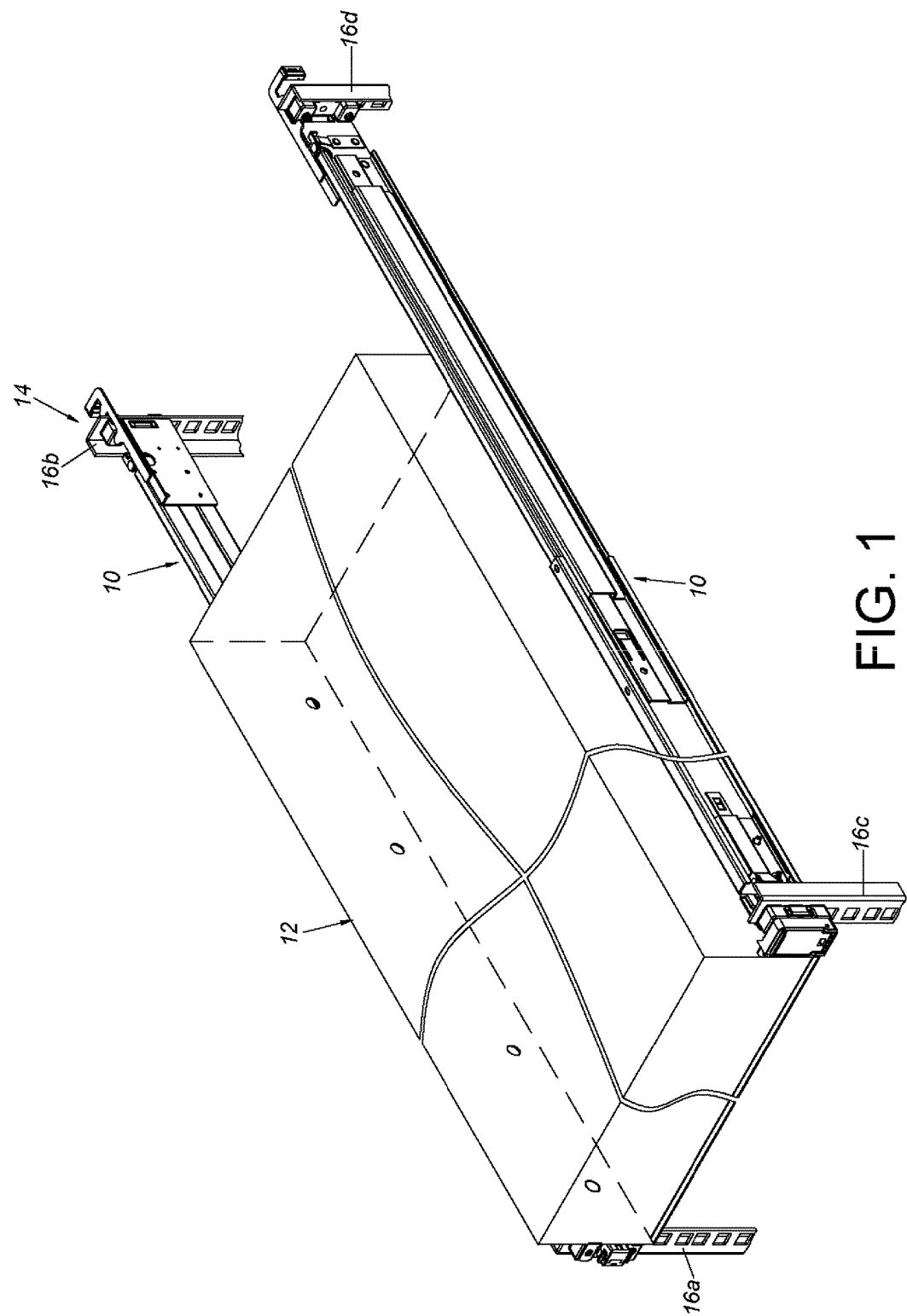
FIG. 1 is a diagram showing a rack system according to an embodiment of the present invention.

FIG. 1 is a diagram showing a rack system according to an embodiment of the present invention. The rack system comprises a pair of slide rail assemblies 10 configured to mount a chassis, such as a first chassis 12 (ex. a 2u chassis), to a rack 14. Wherein, the rack 14 comprises a first post 16a, a second post 16b, a third post 16c and a fourth post 16d. One of the slide rail assemblies 10 is mounted to the first post 16a and the second post 16b of the rack 14. The other one of the slide rail assemblies 10 is mounted to the third post 16c and the fourth post 16d of the rack 14. Two sides of the first chassis 12 are mounted on the pair of slide rail assemblies 10.

Figure 2:
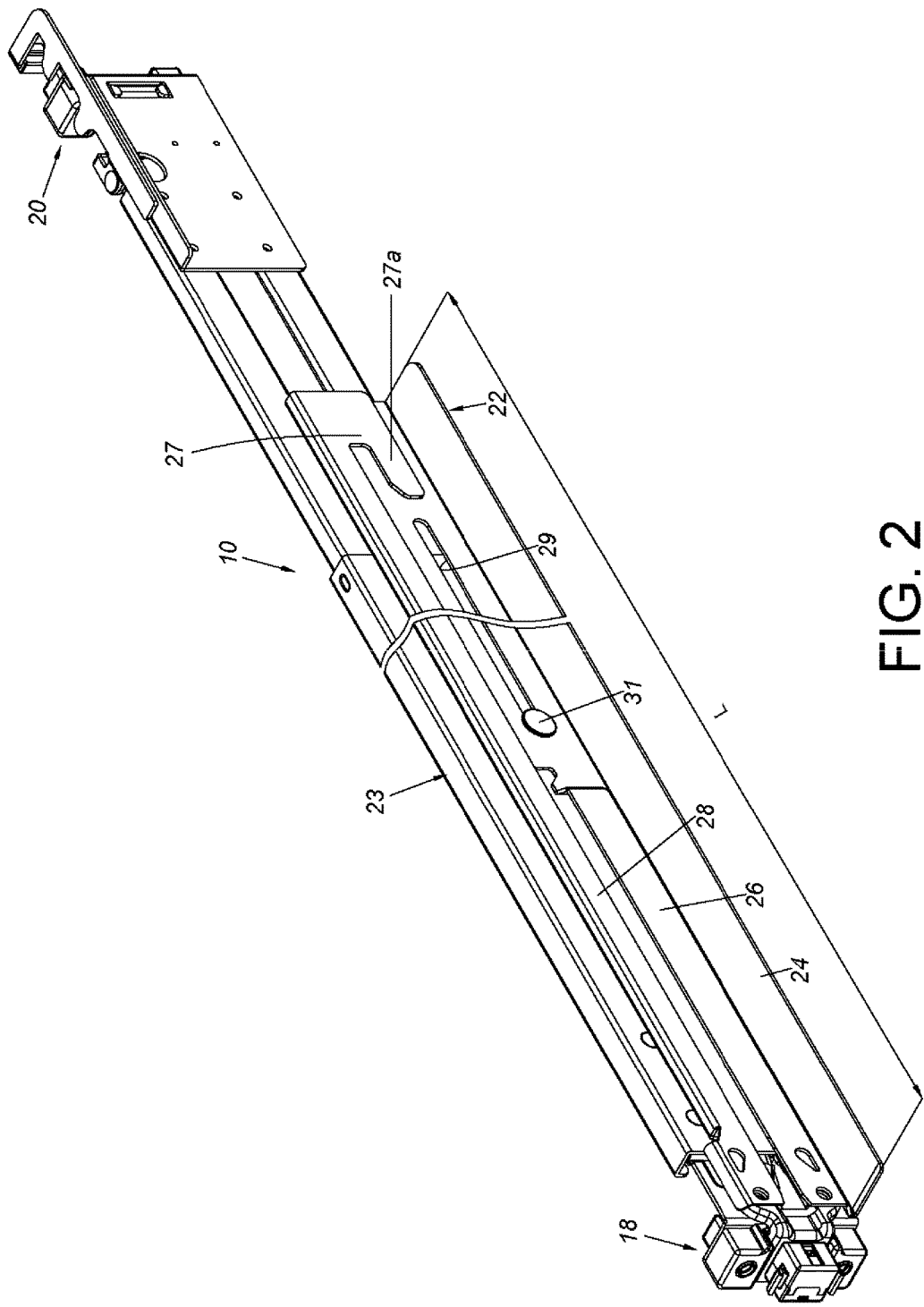
FIG. 2 is a diagram showing a slide rail assembly according to an embodiment of the present invention.
Figure 3:
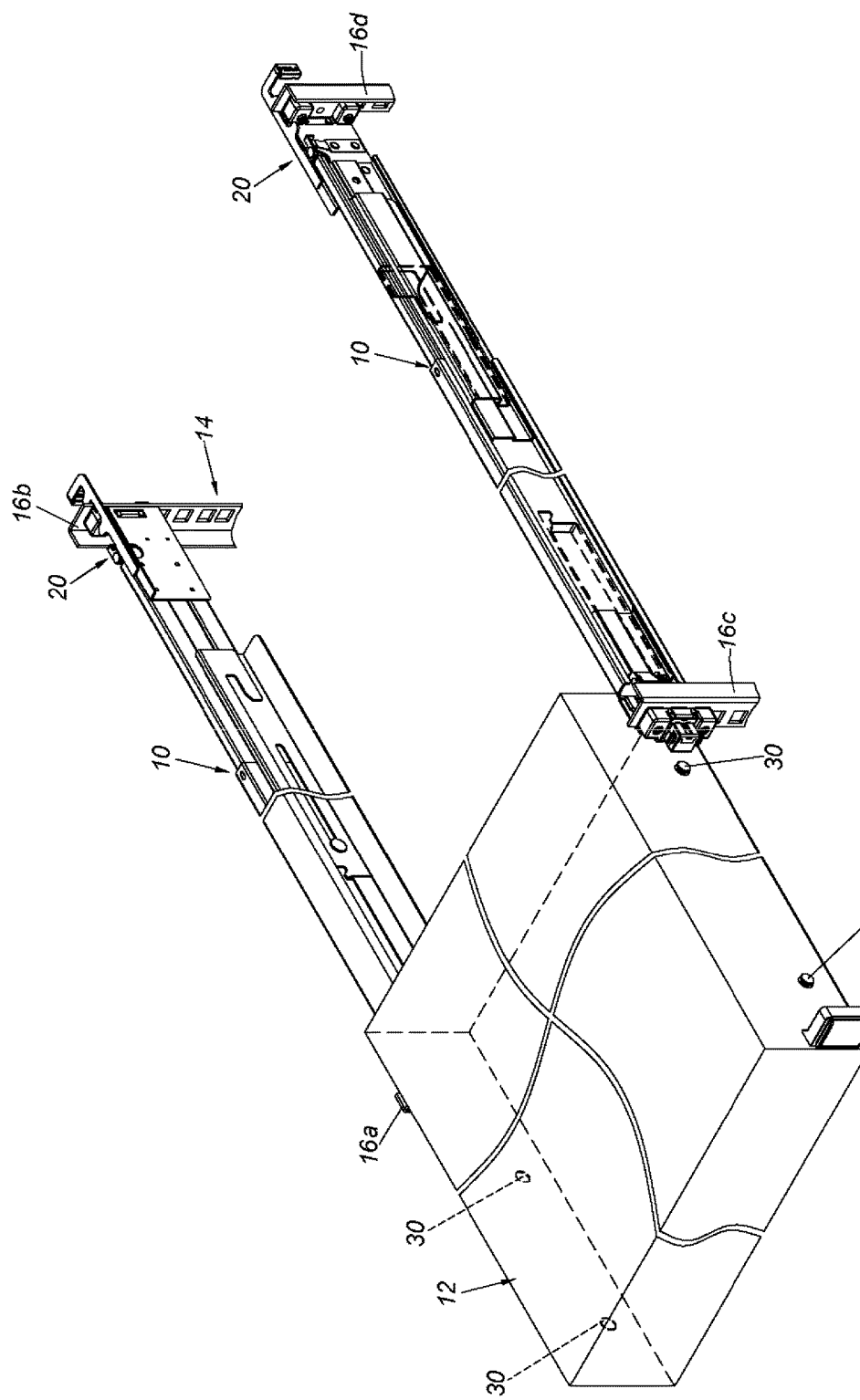
FIG. 3 is a diagram showing a front end of a guide rail of the slide rail assembly being configured to mount a first chassis according to an embodiment of the present invention.

As shown in FIG. 2 and FIG. 3, the slide rail assembly 10 comprises a first bracket 18 and a second bracket 20 configured to be respectively mounted to the first post 16a and the second post 16b of the rack 14. The slide rail assembly 10 further comprises a guide rail 22 and a supporting frame 23. Wherein, the guide rail 22 has a first rail section 24, a second rail section 26 and a third rail section 28. In addition, each of two opposite sides of the first chassis 12 is arranged with at least one fixing member. For example, a plurality of first fixing members 30 are arranged on the two opposite sides of the first chassis 12.

In a preferred embodiment, the guide rail 22 further has a bounded longitudinal hole 29, and a connecting member 31 is connected to the supporting frame 23 through the longitudinal hole 29, such that the guide rail 22 is movable relative to the supporting frame 23 within a limited space.

Figure 5:
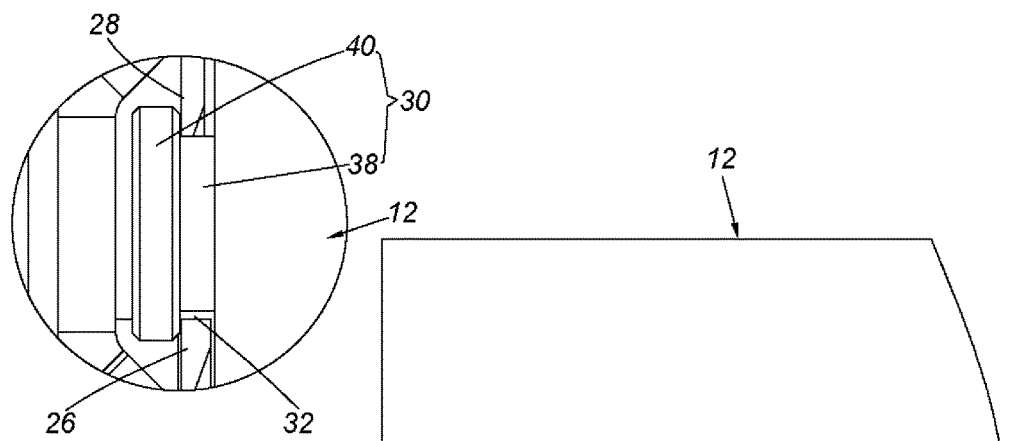
FIG. 5 is an enlarged view of an area A of FIG. 4.
Figure 4:
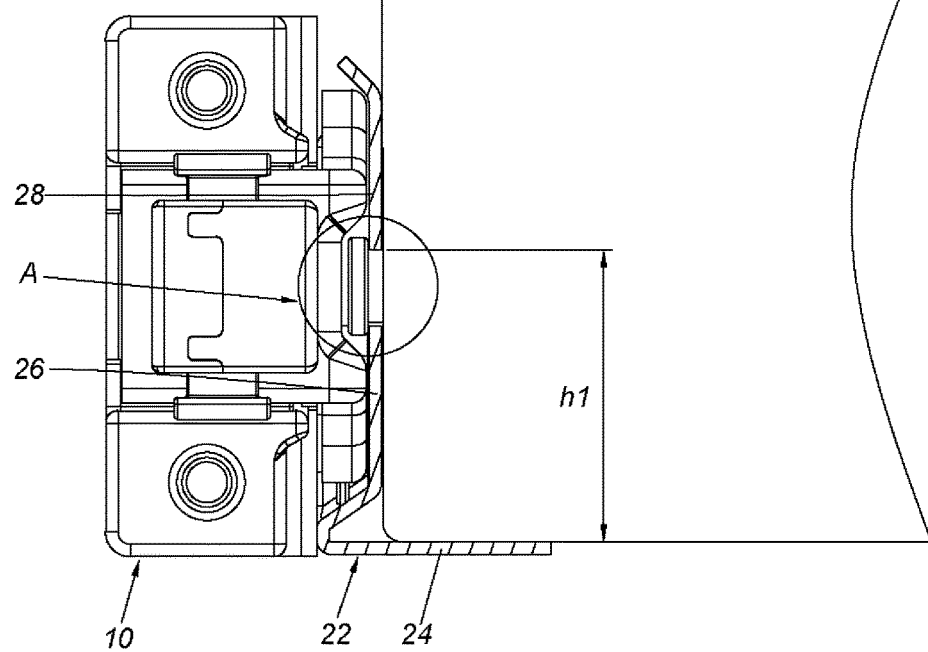
FIG. 4 is a diagram showing the guide rail of the slide rail assembly being configured to mount the first chassis according to an embodiment of the present invention.

As shown in FIG. 4 and FIG. 5, the first rail section 24 of the guide rail 22 is configured to support a portion (such as a bottom part) of the first chassis 12. The third rail section 28 is arranged above the second rail section 26, and a path 32 is defined between the second rail section 26 and the third rail section 28 for allowing the first fixing member 30 to pass through. Wherein, the first rail section 24 is bent relative to the second rail section 26, for example, the first rail section 24 of the guide rail 22 is substantially perpendicularly connected to the second rail section 26 of the guide rail 22 for supporting the portion of the first chassis 12.

In a preferred embodiment, the first fixing member 30 has a first fixing part 38 and a second fixing part 40 connected to the first fixing part 38. The first fixing part 38 is connected to the first chassis 12. An outer diameter of the second fixing part 40 is greater than an outer diameter of the first fixing part 38. When the first chassis 12 is mounted to the guide rail 22, the first rail section 24 of the guide rail 22 is configured to support the portion (the bottom part) of the first chassis 12, and the first fixing member 30 of the first chassis 12 is configured to pass through the path 32 of the guide rail 22. The first fixing part 38 of the first fixing member 30 is configured to abut against a lower edge of the third rail section 28 of the guide rail 22, and one side of the second rail section 26 and one side of the third rail section 28 of the guide rail 22 are configured to support another portion (such as a side wall) of the first chassis 12. Through the above arrangement, the first chassis 12 can be quickly mounted, and the guide rail 22 of the slide rail assembly can firmly support the first chassis 12.

In particular, a first height h1 is defined between the lower edge of the third rail section 28 of the guide rail 22 and the first rail section 24 of the guide rail 22. The first height h1 allows the first fixing member 30 on the first chassis 12 to abut against the lower edge of the third rail section 28 of the guide rail 22.

In a preferred embodiment, as shown in FIG. 2, the second rail section 26 of the guide rail 22 is located at a front end of the guide rail 22. In addition, the guide rail 22 further has a rear blocking part 27 located at a rear end of the guide rail 22.

In a preferred embodiment, as shown in FIG. 2, the first rail section 24 of the guide rail 22 has a length L. The third rail section 28 of the guide rail 22 is extended along a longitudinal direction of the first rail section 24 of the guide rail 22 and connected to the rear blocking part 27.

Figure 7:
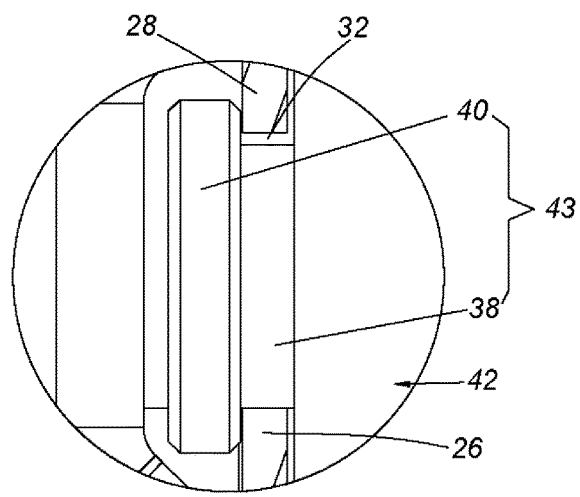
FIG. 7 is an enlarged view of an area B of FIG. 6.
Figure 6:
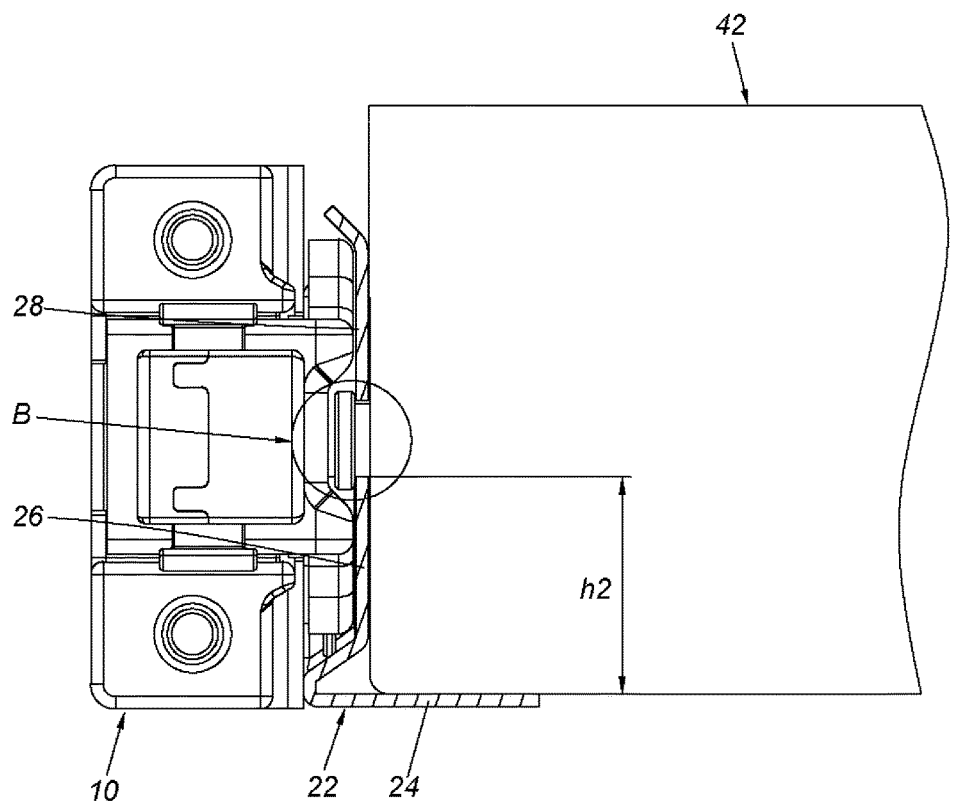
FIG. 6 is a diagram showing the guide rail of the slide rail assembly being configured to mount a second chassis according to an embodiment of the present invention.

As shown in FIG. 6 and FIG. 7, when the slide rail assembly 10 is configured to mount a chassis with another specification, such as a second chassis 42 (ex. an 1U chassis), the first rail section 24 of the guide rail 22 is configured to support a portion (such as a bottom part) of the second chassis 42. The second chassis 42 is arranged with at least one fixing member, such as a second fixing member 43. An outline of the second fixing member 43 is identical to an outline of the first fixing member 30, and the second fixing member 43 is configured to pass through the path 32 of the guide rail 22. The first fixing part 38 of the second fixing member 43 is configured to abut against an upper edge of the second rail section 26 of the guide rail section, and one side of the second rail section 26 and one side of the third rail section 28 of the guide rail 22 are configured to support another portion (such as a side wall) of the second chassis 42. As such, the second chassis 42 can be quickly mounted, and the guide rail 22 of the slide rail assembly can also firmly support the second chassis 42.

In particular, a second height h2 is defined between the upper edge of the second rail section 26 of the guide rail 22 and the first rail section 24 of the guide rail 22, and the second height h2 is different from the first height h1. The second height h2 allows the second fixing member 43 of the second chassis 42 to abut against the upper edge of the second rail section 26 of the guide rail 22. Moreover, the rear blocking part 27 of the guide rail 22 is extended with a rear supporting part 27a. An upper edge of the rear supporting part 27a is configured to abut against the second fixing member 43 of the second chassis 42.

According to aforementioned embodiments, the present invention can quickly mount the chassis 12, 42 with different specifications (such as 1U chassis and 2U chassis) and firmly support the chassis 12, 42 with the different specifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly for a rack system mounting a chassis to a rack, the slide rail assembly comprising:

a fixing member arranged on one side of the chassis;

a guide rail having a first rail section, a second rail section and a third rail section, wherein the first rail section is bent relative to the second rail section for supporting a portion of the chassis, the third rail section is arranged above the second rail section, a path is defined between the second rail section and the third rail section for allowing the fixing member on the chassis to pass through; and a supporting frame, wherein the guide rail is movably connected to the supporting frame;

wherein when the chassis is mounted to the guide rail, the fixing member on the chassis passes through the path of the guide rail, and the fixing member on the chassis abuts against one of the second rail section and the third rail section of the guide rail;

wherein the guide rail has a bounded longitudinal hole, and is connected to the supporting frame through a connecting member passing through the longitudinal hole, such that the guide rail is movable relative to the supporting frame within a limited space.

2. The slide rail assembly of claim 1, wherein the fixing member on the chassis has a first fixing part and a second fixing part connected to the first fixing part, the first fixing part is connected to the chassis, an outer diameter of the second fixing part is greater than an outer diameter of the first fixing part; wherein when the chassis is mounted to the guide rail, the fixing member on the chassis passes through the path of the guide rail, and the first fixing part of the fixing member on the chassis abuts against one of an upper edge of the second rail section and a lower edge of the third rail section, one side of the second rail section and one side of the third rail section of the guide rail are configured to support another portion of the chassis.

3. The slide rail assembly of claim 1, wherein the second rail section of the guide rail is located at a front end of the guide rail, the guide rail further has a rear blocking part located at a rear end of the guide rail.

4. The slide rail assembly of claim 3, wherein the third rail section of the guide rail is extended along a longitudinal direction of the first rail section of the guide rail and connected to the rear blocking part.

5. The slide rail assembly of claim 3, wherein the rear blocking part of the guide rail is extended with a rear supporting part, an upper edge of the rear supporting part is configured to abut against the fixing member on the chassis.

6. A slide rail assembly for a rack system mounting a chassis to a rack, the slide rail assembly comprising:
a fixing member arranged on one side of the chassis; and
a guide rail having a first rail section, a second rail section and a third rail section, wherein the first rail section is bent relative to the second rail section for supporting a portion of the chassis, the third rail section is arranged above the second rail section, a path is defined between the second rail section and the third rail section for allowing the fixing member on the chassis to pass through;

wherein the fixing member on the chassis has a first fixing part and a second fixing part connected to the first fixing part, the first fixing part is connected to the chassis, an outer diameter of the second fixing part is greater than an outer diameter of the first fixing part, wherein when the chassis is mounted to the guide rail, the first fixing part of the fixing member on the chassis abuts against a lower edge of the third rail section of the guide rail, and one side of the second rail section and one side of the third rail section of the guide rail are configured to support another portion of the chassis;

wherein the second rail section of the guide rail is located at a front end of the guide rail, the guide rail further has a rear blocking part located at a rear end of the guide rail, the third rail section of the guide rail is extended along a longitudinal direction of the first rail section of the guide rail and connected to the rear blocking part.

7. A slide rail assembly for a rack system mounting a chassis to a rack, the slide rail assembly comprising:
a fixing member arranged on one side of the chassis; and
a guide rail having a first rail section, a second rail section and a third rail section, wherein the first rail section is bent relative to the second rail section for supporting a portion of the chassis, the third rail section is arranged above the second rail section;

wherein the fixing member on the chassis has a first fixing part and a second fixing part connected to the first fixing part, the first fixing part is connected to the chassis, an outer diameter of the second fixing part is greater than an outer diameter of the first fixing part, wherein when the chassis is mounted to the guide rail, the first fixing part of the fixing member on the chassis abuts against an upper edge of the second rail section of the guide rail, and one side of the second rail section and one side of the third rail section of the guide rail are configured to support another portion of the chassis;

wherein the second rail section of the guide rail is located at a front end of the guide rail, the guide rail further has a rear blocking part located at a rear end of the guide rail, the rear blocking part of the guide rail is extended with a rear supporting part, an upper edge of the rear supporting part is configured to abut against the fixing member on the chassis.

8. A slide rail assembly for a rack system mounting a chassis to a rack, the slide rail assembly comprising:
a fixing member arranged on one side of the chassis; and
a guide rail having a first rail section, a second rail section and a third rail section, wherein the first rail section is bent relative to the second rail section for supporting a portion of the chassis, the third rail section is arranged above the second rail section, a path is defined between the second rail section and the third rail section for allowing the fixing member on the chassis to pass through;

wherein when the chassis is mounted to the guide rail, the fixing member on the chassis passes through the path of the guide rail, and the fixing member on the chassis abuts against one of the second rail section and the third rail section of the guide rail;

wherein the second rail section of the guide rail is located at a front end of the guide rail, the guide rail further has a rear blocking part located at a rear end of the guide rail;

wherein the third rail section of the guide rail is extended along a longitudinal direction of the first rail section of the guide rail and connected to the rear blocking part.

9. The slide rail assembly of claim 8, further comprising a supporting frame, wherein the guide rail is movably connected to the supporting frame.

10. The slide rail assembly of claim 8, wherein the fixing member on the chassis has a first fixing part and a second fixing part connected to the first fixing part, the first fixing part is connected to the chassis, an outer diameter of the second fixing part is greater than an outer diameter of the first fixing part; wherein when the chassis is mounted to the guide rail, the fixing member on the chassis passes through the path of the guide rail, and the first fixing part of the fixing member on the chassis abuts against one of an upper edge of the second rail section and a lower edge of the third rail section, one side of the second rail section and one side of the third rail section of the guide rail are configured to support another portion of the chassis.

11. The slide rail assembly of claim 8, wherein the rear blocking part of the guide rail is extended with a rear supporting part, an upper edge of the rear supporting part is configured to abut against the fixing member on the chassis.

12. A slide rail assembly for a rack system mounting a chassis to a rack, the slide rail assembly comprising:
   a fixing member being arranged on one side of the chassis; and
   a guide rail having a first rail section, a second rail section and a third rail section, wherein the first rail section is bent relative to the second rail section for supporting a portion of the chassis, the third rail section is arranged above the second rail section, a path is defined between the second rail section and the third rail section for allowing the fixing member on the chassis to pass through;
   wherein when the chassis is mounted to the guide rail, the fixing member on the chassis passes through the path of the guide rail, and the fixing member on the chassis abuts against one of the second rail section and the third rail section of the guide rail;
   wherein the second rail section of the guide rail is located at a front end of the guide rail, the guide rail further has a rear blocking part located at a rear end of the guide rail;
   wherein the rear blocking part of the guide rail is extended with a rear supporting part, an upper edge of the rear supporting part is configured to abut against the fixing member on the chassis.

13. The slide rail assembly of claim 12, further comprising a supporting frame, wherein the guide rail is movably connected to the supporting frame.

14. The slide rail assembly of claim 12, wherein the fixing member on the chassis has a first fixing part and a second fixing part connected to the first fixing part, the first fixing part is connected to the chassis, an outer diameter of the second fixing part is greater than an outer diameter of the first fixing part; wherein when the chassis is mounted to the guide rail, the fixing member on the chassis passes through the path of the guide rail, and the first fixing part of the fixing member on the chassis abuts against one of an upper edge of the second rail section and a lower edge of the third rail section, one side of the second rail section and one side of the third rail section of the guide rail are configured to support another portion of the chassis.

\* \* \* \* \*